United States Patent
Feigenbaum et al.

(10) Patent No.: US 11,294,103 B2
(45) Date of Patent: Apr. 5, 2022

(54) SYSTEM AND METHOD FOR REPEATED METAL DEPOSITION-DEWETTING STEPS TO FORM A NANO-PARTICLE ETCHING MASK PRODUCING THICKER LAYER OF ENGRAVED METASURFACE

(71) Applicant: Lawrence Livermore National Security, LLC, Livermore, CA (US)

(72) Inventors: Eyal Feigenbaum, Livermore, CA (US); Nathan James Ray, Tracy, CA (US); Jae Hyuck Yoo, Dublin, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/875,337

(22) Filed: May 15, 2020

(65) Prior Publication Data

US 2021/0356626 A1 Nov. 18, 2021

(51) Int. Cl.
*G02B 1/12* (2006.01)
*G02B 1/00* (2006.01)
*G02B 1/11* (2015.01)

(52) U.S. Cl.
CPC .............. *G02B 1/12* (2013.01); *G02B 1/002* (2013.01); *G02B 1/11* (2013.01)

(58) Field of Classification Search
CPC .............. G02B 1/12; H01L 21/31144; H01L 21/32139; H01L 21/0337; H01L 21/3086
See application file for complete search history.

(56) References Cited

U.S. PATENT DOCUMENTS

| | | | |
|---|---|---|---|
| 6,300,221 B1 | 10/2001 | Roberds et al. | |
| 10,612,145 B2 | 4/2020 | Feigenbaum | |
| 2010/0075114 A1 | 3/2010 | Kurihara et al. | |
| 2018/0202037 A1* | 7/2018 | Blush | C23C 14/022 |
| 2018/0363148 A1* | 12/2018 | Feigenbaum | H01L 21/76808 |
| 2020/0131083 A1* | 4/2020 | Couderc | G02B 1/10 |
| 2020/0257194 A1* | 8/2020 | Sorin | B81C 1/0046 |
| 2020/0266061 A1* | 8/2020 | Robinson | B32B 15/16 |

FOREIGN PATENT DOCUMENTS

| | | |
|---|---|---|
| JP | 2017523594 A | 8/2017 |
| WO | WO-2013171284 A1 | 11/2013 |

OTHER PUBLICATIONS

Cai, et al "Recent Advances in Antireflective Surfaces Based on Nanostructure Arrays," Mater. Horiz. 2, 37-53 (2015).

(Continued)

*Primary Examiner* — Binh X Tran
(74) *Attorney, Agent, or Firm* — Harness Dickey & Pierce PLC

(57) ABSTRACT

A method and system is disclosed for creating an optical component having a spatially controlled refractive index and uniform anti-reflective layer. The method may involve alternately depositing and dewetting two or more thin metal material layers on the substrate to form a mask having a spatially varying nano-particle distribution, and with an increased thickness beyond what could be achieved using a single, thick layer of the same material. The substrate may then be etched, using the mask, to imprint a spatially patterned nanostructure pattern on a surface the substrate in accordance with the mask.

20 Claims, 5 Drawing Sheets

(56) References Cited

OTHER PUBLICATIONS

Infante, et al, "Superhydrophobic, Antireflection, and Low Haze Glass Surfaces Using Scalable Metal Dewetting Nanostructuring," Nano Res. 6, 429-440 (2013).

Hoang, et al, "Fabrication of GaN-based nanorod light emitting diodes using self-assemble nickel nano-mask and inductively coupled plasma reactive ion etching," Materials Science and Engineering B 113, 125-129 (2004).

Yoo, et al, "Scalable Light-Printing of Substrate-Engraved Free-Form Metasurfaces," ACS Appl. Mater. Interfaces 11, 22684-22691 (2019).

Kargupta, et al, "Templating of Thin Films Induced by Dewetting on Patterned Surfaces," Phys. Rev. Lett. 86, 4536 (2001).

Kargupta, et al, "Dewetting of Thin Films on Periodic Physically and Chemically Patterned Surfaces," Langmuir 18, 1893-1903 (2002).

Ondarcüuhu, et al, "Pinning of a Contact Line on Nanometric Steps during the Dewetting of a Terraced Substrate," Nano Lett. 5, 1744-1750 (2005).

Lu, et al, "Nanostructure Formation by controlled dewetting on patterned substrates: A combined theoretical, modeling and experimental study," Scientific Reports | 6:32398 | DOI: 10.1038/srep32398 (2016).

Sun, et al, "Gold nanoisland arrays by repeated deposition and post-deposition annealing for surface-enhanced Raman spectroscopy" Nanotechnology 24, 355706 (2013).

Kang, et al, "Repeated Solid-state Dewetting of Thin Gold Films for Nanogap-rich Plasmonic Nanoislands" Scientific Reports | 5:14790| DOI: 10.1038/srep14790.

de Almeida, et al, "Plasmonic Optical Fiber Sensor Based on Double Step Growth of Gold Nano-Islands," Sensors 18, 1267 (2018).

International Search Report and Written Opinion regarding Application No. PCT/US2021/032490, dated Sep. 7, 2021.

\* cited by examiner

Thin Metal Deposition

Dewetting

Dry Etching

Mask Removal

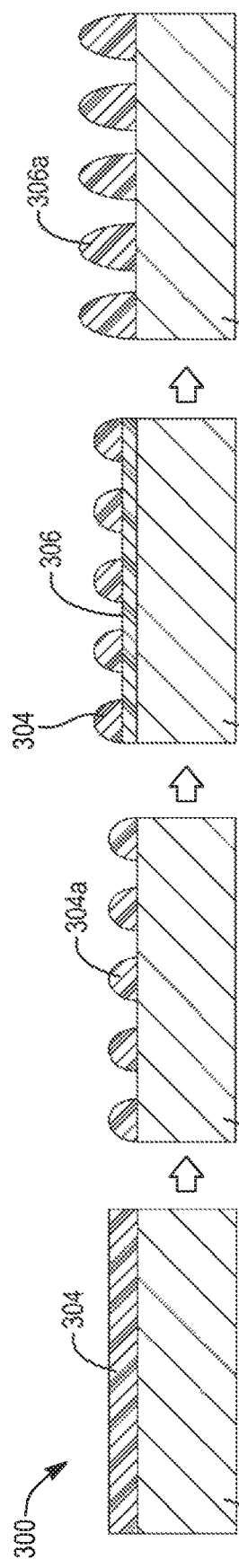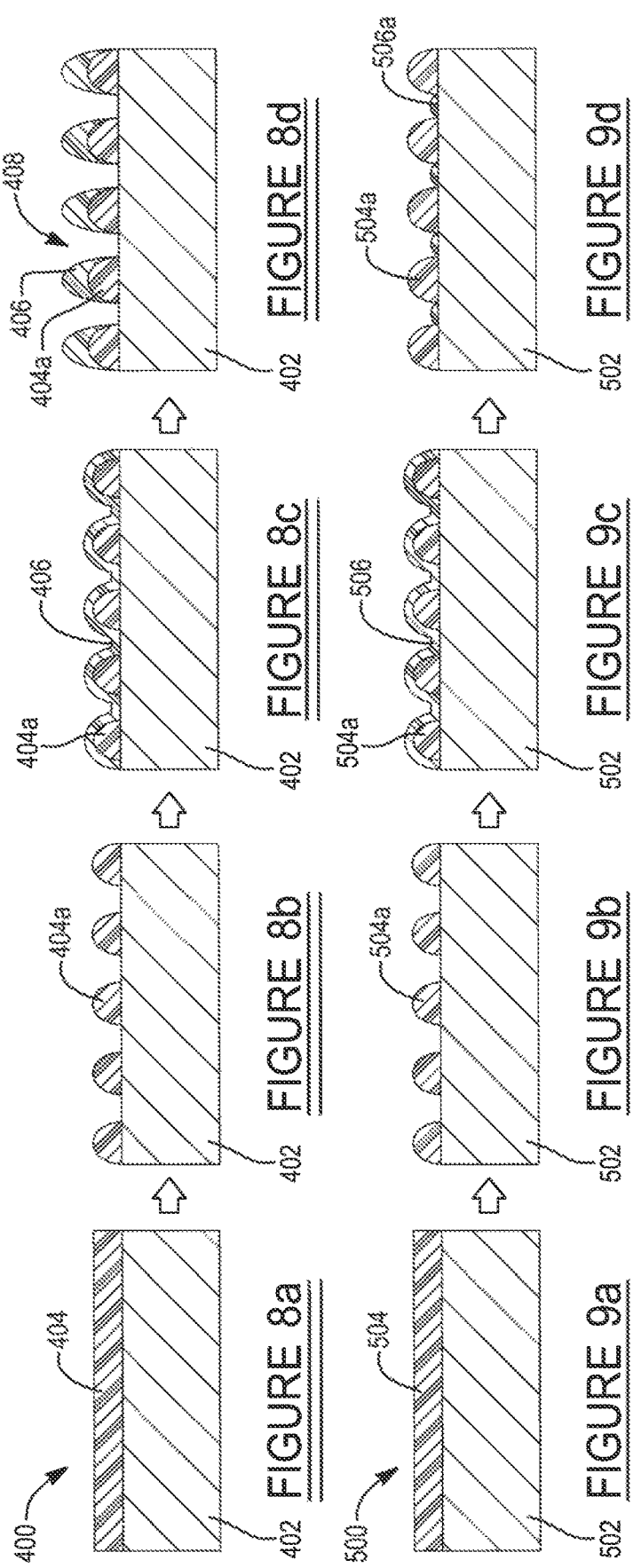

SYSTEM AND METHOD FOR REPEATED METAL DEPOSITION-DEWETTING STEPS TO FORM A NANO-PARTICLE ETCHING MASK PRODUCING THICKER LAYER OF ENGRAVED METASURFACE

STATEMENT OF GOVERNMENT RIGHTS

This invention was made with Government support under Contract No. DE-AC52-07NA27344 awarded by the United States Department of Energy. The Government has certain rights in the invention.

FIELD

The present disclosure relates to systems and methods for producing nanoparticle etching masks to develop a substrate-engraved meta-surface with enhanced thickness.

BACKGROUND

The statements in this section merely provide background information related to the present disclosure and may not constitute prior art.

An Anti-reflective (AR) coating for an optic is a critical component in present day laser systems, as well as other types of present day imaging systems. An AR coating is typically applied to every optical component at its two interfaces with air. The AR coating helps to prevent uncontrolled stray light from entering into an optic of a laser system or an imaging system, as well as helping to improve transmission of the conducted light through the optical systems.

The existing implementation technologies for anti-reflective layers that rely on coating techniques, i.e., depositing the AR layer on a surface of an optic, are limited. Sol-gel coating is limited with respect to possible substrate material (due to available sol index), uniformity and environmental stability. Multi-layer dielectric coating is limited in its durability (e.g., laser induced damage) and complexity.

Other prior art that is generally related to the subject matter of the present disclosure, but still bears important differences, can be arranged into two categories. These prior art studies may involve dewetting in a general sense, or may involve dewetting for the purpose of forming a mask, but which still differ significantly from the present disclosure. One such category is where dewetting is used not for the purpose of forming a mask, but merely to change the size and/or shape of nanoparticles on a surface. While typically the process parameters (e.g., as-deposited layer thickness and material, dewetting temperature) are used to control the distribution, this control is limited. Enhancing this control is at the focus of this invention. In a sub-set of the prior art studies there is a usage of pre-patterning of the substrate before the to-be-dewetted layer is deposited, where the thin film is deposited on a pre-patterned substrate surface (typically by means of lithography) to modify the nanoparticle spatial distribution. A significant disadvantage of this scheme is the added complexity of the lithography step. Another significant disadvantage is that the pre-patterning of the substrate, which is meant to be used as an optical element, will affect its optical function (typically limiting the fill-fraction range), and as such typically limits this method's usability for making optical elements.

A second category involves dewetting of a thin film for the purpose of forming a mask using one deposition/dewetting operation sequence of operations. With this methodology, a substrate-engraved nano-structure can be created that forms a meta-surface (MS) with an AR property. Being monolithic to the substrate (i.e., no additional materials and interfaces) makes it very durable (i.e., environmentally, laser fluence, thermal).

FIG. 1 shows a high level representation of a fabrication method generally in accordance with the disclosure of U.S. Pat. No. 10,612,145 to Feigenbaum, issued Apr. 7, 2020, and assigned to the assignee of the present disclosure. The methodology disclosed in this patent relates to the second category discussed above, and provides the important advantage of being scalable for obtaining substrate-engraved meta-surfaces ("SEMS"). Such a SEMS is critical to powerful laser systems which require both durability and large aperture compatibility. The process illustrated in FIG. 1 is a four-step process which involves depositing a thin metal layer $10a$ on the substrate $10b$ (i.e., the optical element to be engraved with a SEMS), as shown in FIG. $1a$. A second step involves thermally annealing or dewetting the metal layer $10a$ into metal nanoparticles $12a$, as shown in FIG. $1b$. Typically, the energy deposition may be performed using a computer controlled laser raster scan (or a shaped large beam) to form a spatially patterned energy deposition (e.g., to form optics), or in an oven, furnace, or rapid thermal annealer to form a spatially uniform energy deposition (e.g., to form AR). The resulting nanoparticles (NP) $12a$ have a typical dome-like shape governed by surface energy optimization and form a nanoparticle "blocking mask". A third operation, shown in FIG. $1c$, involves dry etching through the metal nanoparticles $12a$ that serve as the nanoparticle blocking mask for the etching ions. This operation serves to transfer the mask $14$ formed by the nanoparticles $12b$ into the substrate $10b$. Finally, a fourth operation involves removing the nanoparticle mask $14$ made up of nanoparticles $12a$, typically by a wet process, as indicated in FIG. $1d$. At the end of the process (FIG. $1d$) only the substrate $10b$ and the structurally engineered metasurface $14a$ remain, with the SEMS being represented by number $14a$ in FIG. $1d$. The SEMS functions as an AR layer based on the averaged effective index of the substrate $10b$ and the air vacancies refractive index in the formed surface layer. The nanoscale size of the features of the SEMS (i.e., sub-wavelength) enable the function as an averaged index, with a value that is determined by the nano-metric geometrical features of the SEMS. As an added advantage, the resulting SEMS typically also provide a broadband of wavelength and a broad acceptance angle of operation.

One limitation of the four step process described above is its limited etch ratio between the mask material $10a$ and the substrate $10b$, which limits the maximal SEMS depth attainable due to mask depletion. For a given substrate, the choice of mask material properties governs both the etch ratio and the dewetting-induced nanoparticle size. Since the de-wetted nanoparticle diameter should be substantially smaller than the optical wavelength (typically tens of nm) to function as a SEMS, that puts limitations on the acceptable nanoparticle height; subsequently, the limited etch ratio leads to limitations of the maximal achievable SEMS layer thickness.

This limitation on the maximal achievable SEMS layer depth translates to a constrained minimal reflectivity that may be achieved for AR applications, and the maximal equivalent optical path difference (OPD) for thin optics applications (e.g., lensing power for a flat lens, or magnitude of aberration correction).

One possible mitigation is to choose a masking material that has a higher etch rate to the selected substrate. However, this is not always possible due to the limited dry-etch formula and mask materials available. Furthermore, the nanoparticle diameter depends as well on the masking material and initial film thickness, and thus the mask material selection may be limited further by additional considerations such as the minimal metal film that may be reliably deposited, and undesired oxidation layer thickness formed on a chosen mask material.

SUMMARY

This section provides a general summary of the disclosure, and is not a comprehensive disclosure of its full scope or all of its features.

In one aspect the present disclosure relates to a method and system for creating an optical component having a spatially controlled refractive index. The method may involve alternately depositing and dewetting two or more thin metal material layers on the substrate to form a mask having a spatially varying nano-particle distribution, and with an increased thickness beyond what could be achieved using a single, thick layer of the same material. The substrate may then be etched, using the mask, to imprint a spatially patterned nanostructure pattern on a surface the substrate in accordance with the mask.

In another aspect the present disclosure relates to a method for creating an optical component having a spatially controlled refractive index. The method may involve providing a substrate and then performing a first deposition operation to form a first thin metal material layer on a surface of the substrate. The first thin metal layer may be formed using a first etching ratio characteristic relative to the substrate. The method may further involve performing a first dewetting operation by heating the first thin metal material layer to create a first layer of a mask having a plurality of nanoparticles with a spatially varying nanoparticle distribution, and with a first height. The method may then further include performing a second deposition operation to deposit a second material to form a second thin metal material layer on the surface of the substrate using a second material. The method may then further include performing a second dewetting operation to dewet the second thin metal material layer. The second dewetting operation causes the second thin metal material layer to accumulate in interstitial spaces between the nanoparticles of the first thin metal material layer to form a second masking layer. The second material has a second etching ratio characteristic relative to the substrate which is different than the first etching ratio characteristic. The method may further include etching a surface of the substrate using the first and second masking layers to imprint a spatially patterned nanostructure pattern on a surface the substrate in accordance with the spatially varying nanoparticle distribution of the first masking layer.

In still another aspect the present disclosure involves a system for creating an optical component having a spatially controlled refractive index. The system may comprise a vacuum chamber which is configured to help perform a first deposition operation to form a first thin metal material layer deposited on a surface of a substrate, where the substrate is positioned within the vacuum chamber. The first deposition is performed using a first material having a first wetting characteristic relative to the substrate. A dewetting subsystem may be included which is configured to perform a first dewetting operation by heating the first thin metal material layer to create a first layer of a mask. The first layer of the mask has a plurality of nanoparticles with a spatially varying nanoparticle distribution, and with a first height. The vacuum chamber is further configured to help perform a second deposition operation to deposit a second thin metal material layer on the surface of the substrate using a second material having a second wetting characteristic relative to the substrate. The dewetting subsystem is further configured to perform a second dewetting operation to dewet the second thin metal material layer. The second dewetting operation causes the second thin metal material layer to accumulate on the nanoparticles to form a second layer of the mask, which increases the first height to a second height, and thus an overall the thickness of the mask. The increase in overall thickness of the mask is achieved without substantially changing the spatially varying nanoparticle distribution of the mask. An etching subsystem may be included which is configured to etch the substrate, using the mask, to imprint a spatially patterned nanostructure pattern on a surface the substrate in accordance with the spatially varying nanoparticle distribution.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

FIGS. 7a-7d are high level side cross sectional drawings which show one methodology in accordance with the present disclosure for creating an enhanced thickness metal surface using the same metal material;

FIGS. 8a-8d are high level side cross sectional drawings which show another methodology for creating an enhanced thickness metal surface using a different material in a subsequent metal material deposition operation, and where the subsequent material has a low wetting action on the substrate; and FIGS. 9a-9d are high level side view cross sectional drawings which show still another methodology for creating an enhanced thickness metal surface using a different material in a subsequent metal material deposition operation, where the subsequent material has a good wetting action on the substrate.

DETAILED DESCRIPTION

Example embodiments will now be described more fully with reference to the accompanying drawings.

The present disclosure relates to systems and methods for enhancing (i.e., increasing) the obtainable depth of substrate-engraved meta-surfaces (SEMS). The systems and methods disclosed in the present disclosure are expected to improve anti-reflective (AR) layer performance and flat-optics functionality for optical components by increasing the obtainable optical path difference variation of SEMS. It will be understood that SEMS are highly durable metasurfaces and scalable, and thus highly relevant to energetic/powerful laser systems. The present disclosure extends the utility of the system disclosed in U.S. Pat. No. 10,612,145, issued Apr. 7, 2020, in a way which enables a significantly enhanced depth of the engraved metasurface to be achieved. In part, the enhanced depth is achieved by incorporating additional operations involve repeating operations 1a and 1b of FIG. 1 more than once using either the same masking metal material or a different masking material. These operations are performed under conditions that increase the height of the nanoparticle features of the nanoparticle mask without substantial change to the lateral characteristics of the nanoparticle features. This enables significantly larger etch depth into the mask without depleting the mask, which is a result of the finite etch ratio of the mask and substrate material.

Figure 1A:
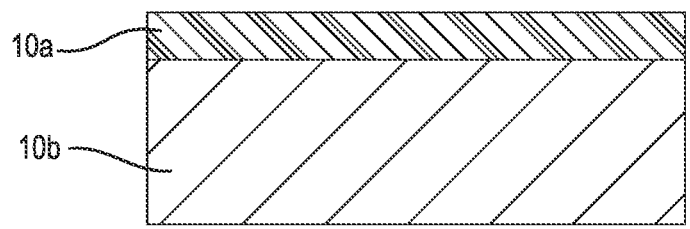
FIGS. 1a-1d are high level side view diagrams showing operations which may be performed using a system and method invented by the assignee of the present disclosure to create a spatially varying refractive index on a substrate surface using a single thin metal film deposition operation and a single, subsequently performed dewetting operation.
Figure 1B:
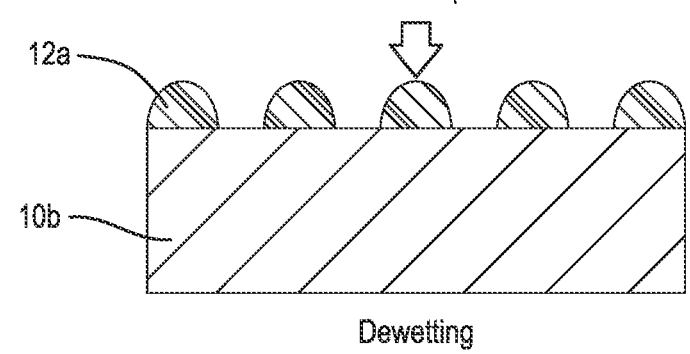
Figure 1C:
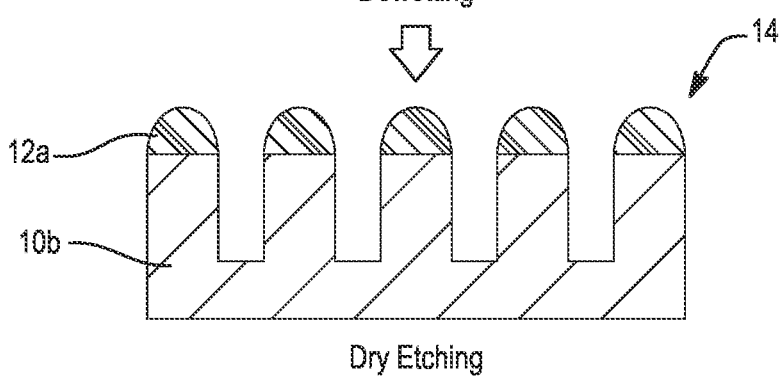
Figure 1D:
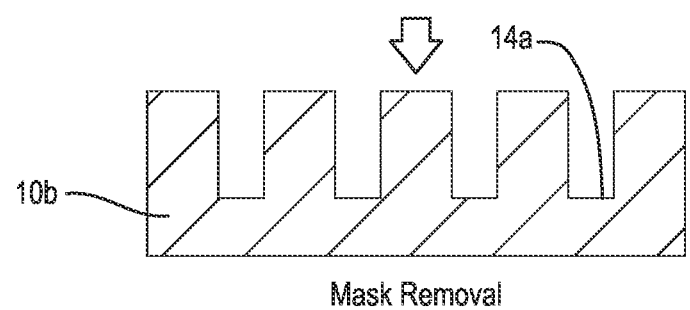
Figure 2B:
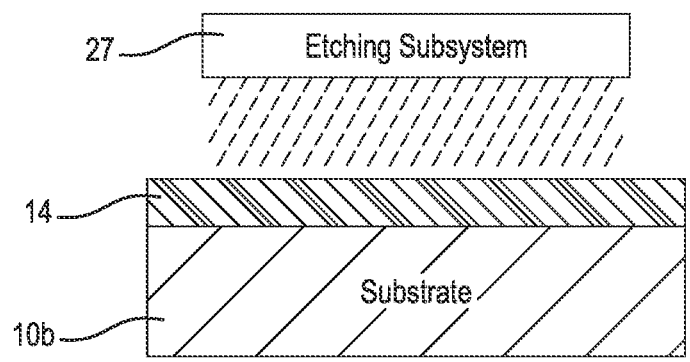
FIG. 2b is a high level side view diagram of an etching subsystem which emits either thermal or optical radiation to help perform an etching process on the substrate using the masking layer deposited on the surface of the substrate.
Figure 2A:
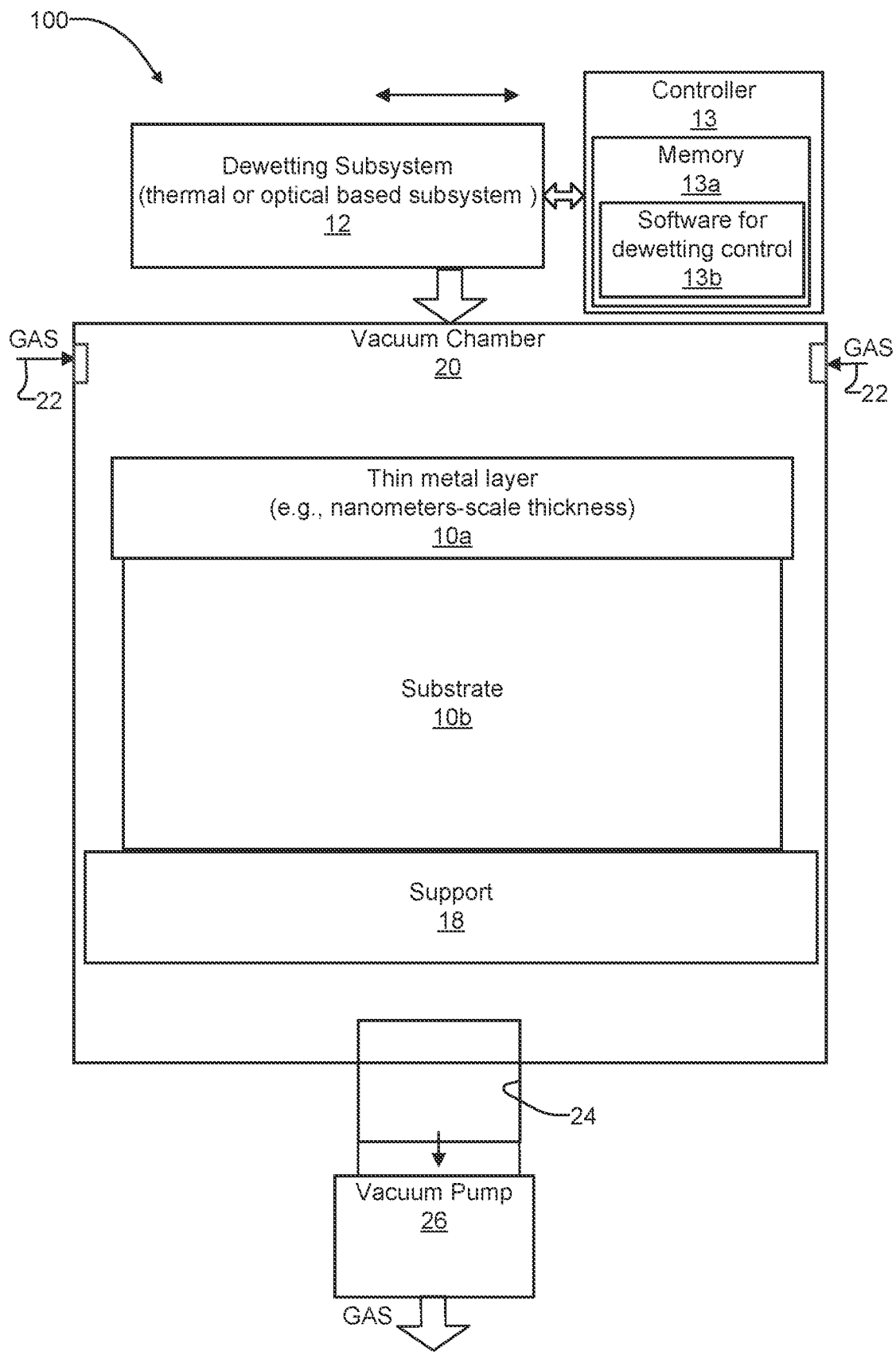
FIG. 2a is a high level diagram of example of a system in accordance with the present disclosure that may be used to produce a highly controlled, spatially varying refractive index on a substrate, in accordance with the present disclosure.

FIGS. 2a and 2b show high level diagrams of various subsystem that may be used to form one embodiment of a system 100 in accordance with the present disclosure. The system 100 may be used to create optical components having spatially controlled refractive indices in accordance with the present disclosure. As shown in FIG. 2a, the system 100 in this example may include a dewetting subsystem 12, which may be a thermally based subsystem or an optically based subsystem that serves to heat a thin metal material layer 14 present on a substrate 16. One suitable thermally based dewetting subsystem may be an Au thin layer mask over fused silica. An example of an optically based dewetting subsystem may be an electromagnetic waveform generator that can be a raster scanned light beam or otherwise a light beam that is reshaped by passing it through an illumination mask before the beam irradiates the thin metal material layer 14. In another example the dewetting subsystem 12 may be a laser which provides a dynamically reshaped laser beam using spatial light modulators (e.g., digital micromirror device (DMD)).

A controller 13 may be included for communicating with and controlling the dewetting subsystem 12. The controller 13 may include a non-volatile memory 13a (e.g., RAM, ROM, etc.) for storing a software module 13b which helps to control the dewetting subsystem 12 in repeatedly carrying multiple dewetting operations when increasing the thickness of the thin metal material layer 10a, as will be described in greater detail in the following paragraphs. An etching subsystem 27 is shown in FIG. 2b which may be an ion based etching subsystem (e.g., Reactive Ion Beam Etching (RIBE); Reactive Ion Etching (RIE)), for etching the substrate 10b using a masking layer 14 formed from one or several layers of material during one or several deposition/dewetting operations.

The substrate 10b may take the form of glass, plastic or any other material suitable for forming an optical component. The thin metal material layer 10a may be, for example Gold (Au), Silver (Ag) or Chromium (Cr), and may initially be quite thin, relatively speaking, when compared to the substrate 10b. In some implementations of the system 10 the thin metal material layer 10a may begin as an initial layer with a thickness on the order of 1-100 nanometers, and even more typically between 1-50 nanometers in thickness. However, it will be appreciated that the system 10 and the methodology described herein is not limited to beginning with a metal material layer 10a of any specific thickness. The thickness of the initial metal material layer 10a, as well as the thickness of subsequent material layers deposited on the initial metal material layer 10a, may depend at least in part on the specific metal material selected for depositing a given layer of material.

The substrate 10b with the initial metal material layer 10a thereon may be supported on a support 18 disposed in a vacuum chamber 20. The vacuum chamber 20 may have one or more ports 22 at one end thereof to admit a gas, and at least one opening 24 at an opposite end of the chamber which is in communication with a vacuum pump 26. This enables an injection of inertial gas or forming a vacuum to reduce the oxidation process of the metal layer, which is typically accelerated during the heating during the dewetting process. The system 10 described above may be used in accordance with the present disclosure to implement the manufacturing operations set forth in the flowchart 200 of FIG. 6, as will be described momentarily.

The initial thin metal layer 10a may be formed using a suitable deposition process, for example thermal evaporation. However, any suitable material deposition process may be used. If the dewetting subsystem 12 is an optically based subsystem, then the dewetting operation may involve one or more light exposures of a laser, and by using a different fluence throughout the irradiation, or by controlling a number of pulses of laser light being applied. Alternatively, this dewetting operation may involve controlling a laser to apply a plurality of exposures with a raster scan-like movement back and forth over the initial thin metal layer 10a. Particularly smooth transitions of the graded-index (GRIN) mask formed by the initial thin metal layer 10a, or obtaining features even smaller than the beam size of the laser forming the dewetting subsystem 12, may be achieved using overlapped multiple passes of the beam during the dewetting operation. In either instance, the dewetting subsystem 12 provides controlled thermal irradiation or spatially controlled optical irradiation to create the nanoparticle features of the mask.

Figure 3:
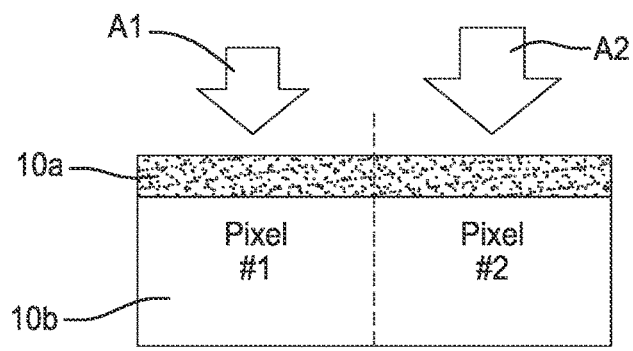
FIG. 3 is a simplified side view of a single thin metal layer formed on a substrate, with portions of the substrate being designated as specific pixels, and where the thin metal layer is about to be de-wetted.
Figure 4:
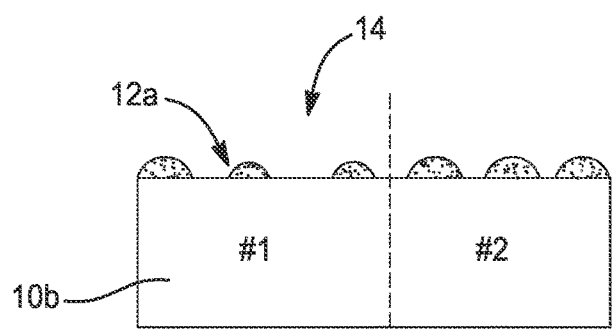
FIG. 4 is a view of the substrate and the thin metal layer after de-wetting, illustrating the nanoparticle features of the formed mask.
Figure 5:
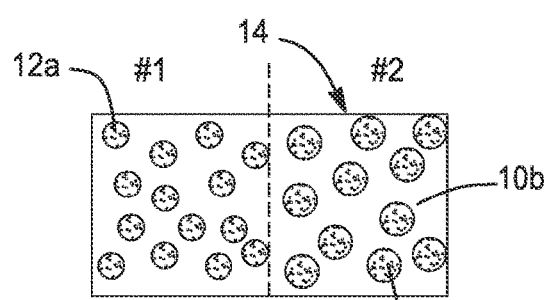
FIG. 5 is a plan (top) view of the mask of FIG. 4 with portions of the substrate visible as well through portions of the mask.

The de-wetted mask 14, at this point, has a highly spatially controlled nanoparticle distribution that may be spatially varying over the area of the mask 14. The nanoparticle distribution essentially forms a nanoparticle featured pattern which imparts different thicknesses and widths throughout the mask 14 during the etching. The mask patterning during light-assisted dewetting is also illustrated in FIG. 3, with arrows A1 and A2 representing different controlled light exposures being applied to different portions of the thin metal layer 10a to create different nanoparticle distributions. FIG. 4 is a side cross-sectional view of the substrate 10b with the nanoparticles 12a making up the newly formed mask 14, while FIG. 5 is a plan (i.e., top) view of the newly formed mask 14 further illustrating the spatially varying nanoparticle 12a distributions. While shaped laser beam or rastered laser beam illumination may be a particularly preferred method for forming the nanoparticle features mask 14 from the metal layer 10a, it will be appreciated that other methods, such as thermal processing, light emitting diodes and other illumination sources could also be used. The use of a laser beam, however, allows for excellent control of the energy temporal deposition profile, better spatial control, and provides advantages with respect to temperature sensitive substrates.

Figure 10:
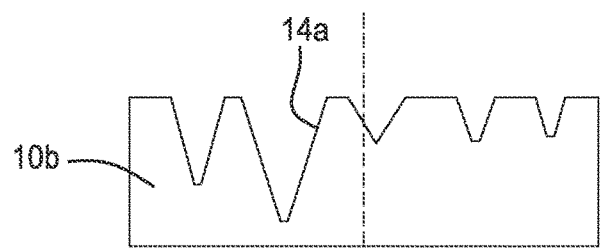
FIG. 10 is a side view of the substrate of FIG. 7d after the etching step and mask removal showing the sub-wavelength features patterned onto the substrate.

FIG. 10 illustrates a side view of an etched substrate 10b after the mask 14 has been removed using selective etching at the end of the manufacturing process, leaving just the SEMS 14. The mask 14 influences the etching process such that the mask 14 is patterned onto the upper surface of the substrate 10b to create the SEMS 14a in accordance with the spatially varying nanoparticle 12a features of the mask 14. While the etching subsystem 27 may use reactive ion etching (RIE), which may be a particularly preferred method for imparting the nanoparticle 12a features of the mask 14 onto the upper surface of the substrate 10b, it will be appreciated that other methods, such wet etching, could also be used.

Figure 6:
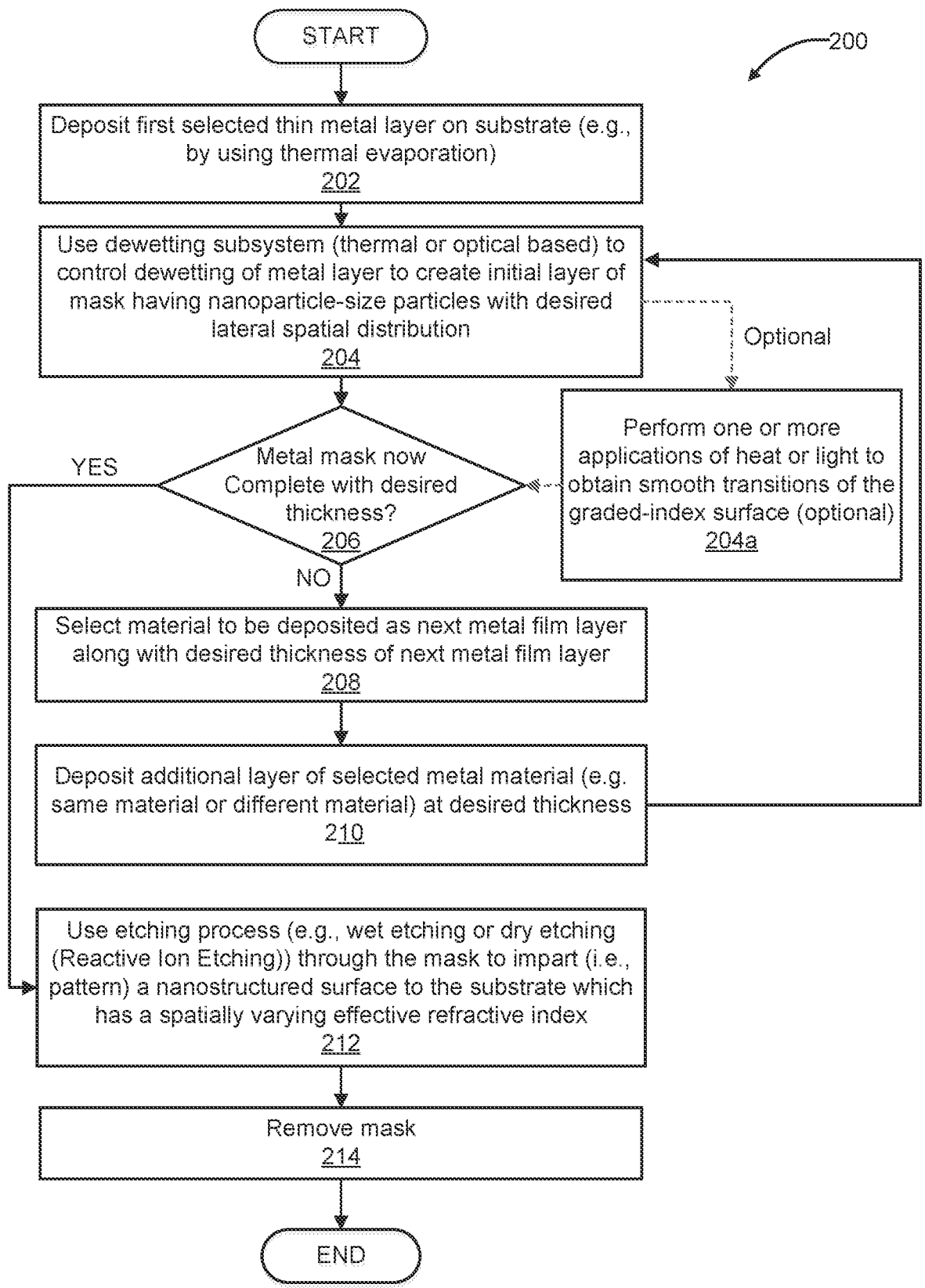
FIG. 6 is a flowchart illustrating various operations that may be performed in creating a highly controlled, uniform or spatially varying index on a substrate having an enhanced thickness metal film nanoparticle mask.

From FIG. 6, it will be noted that the RIE operation to create the patterned substrate (i.e., SEMS) 14a provides for high-aspect ratio surface features to be etched into the surface of the patterned substrate 14a. After the removal of the mask 14, the resulting patterned substrate 14a may be used as a phase plate to implement a "designer at will" freeform optical element, as well as a traditional optical element.

It will also be appreciated that the GRIN spatial variation is limited by the depth of the RIE etching while maintaining the feature's subwavelength lateral scale. Assuming about 1:10 aspect ratio, and features smaller than the wavelength, the method of the present disclosure may potentially reach a few waves equivalent change in GRIN. This potentially enables implementation of freeform optical functions requiring up to a few waves amplitude without using a diffractive optics design (i.e., without using the fact that the phase plate has multi-equivalent planes with 2pi modulus spacing), which is a wavelength sensitive and incident angle sensitive design. This provides an advantage for short pulse laser operation, which is frequently used to achieve high power operation. Deeper wave amplitude functions are enabled by implementing diffractive optics design principles—yet with the advantage of high laser resilience.

Referring to FIG. 6, one example of a methodology 200 showing various operations in accordance with one implementation of the present disclosure is shown which enables a component with a spatially varying refractive surface to be formed. As will be described in more detail in the following paragraphs, the method 200 uses repeated alternating of deposition and dewetting operations to, in one implementation, build up a significantly thicker metal mask layer, layer-by-layer, than what could be accomplished in a single material deposition operation. Importantly, this new process provides a lateral nanoparticle scale that is comparable to the nanoparticle scale that is that created with the previously discussed methodology on a thin layer, yet with an increased thickness masking layer. Part of the reason for this is that the subsequent dewetting operations are performed on perturbed initial conditions of the masking layer by the already dewetted particles formed in previous steps with its lateral dimensions.

At operation 202 an initial thin metal material layer is formed a substrate material. FIG. 7a further illustrates this operation in which a structure 300 having a thin metal layer 304 is initially formed on a substrate 302.

At operation 204 in FIG. 6, irradiation from the dewetting subsystem 12 may be used to begin creating a mask 304a of nanoparticle-size distribution by a first de-wetting operation being performed on the thin metal layer 304. The de-wetted initial metal material layer is layer 304a in FIG. 7b.

Operation 204a is an optional operation which may be performed in which one or more light exposures, using a laser beam as the dewetting subsystem 12, are applied to obtain smooth transitions of the graded-index surface.

At operation 206 a check is made to determine if the metal mask is now complete. If this check produces a "No" answer, then the next material to be used in building up the thin metal layer may be selected by the user as indicated at operation 208. This material may be the same material used at operation 202 or it may be a different material. At operation 210 the newly selected material may be deposited on the previously formed thin metal layer. This is also illustrated in FIG. 7c, where the additional metal layer is identified by reference number 306. As visible in FIG. 7c, at this stage the additional metal layer 306 fully or substantially fills in the interstitial spaces between the nanoparticles which form the initial metal material layer 304a, but does not tangibly increase the thickness variations of the mask 304a. Subsequently, however, operation 204 is repeated to dewet the additional metal layer 306. The dewetting causes the metal material of the layer 306 to flow onto the nanoparticles of the mask 304a to create a new, thicker nanoparticle mask layer 306a, as indicated in FIG. 7d.

Multiple repetitions of 206-210 could be executed, and when the check at operation 206 indicates that the metal mask is now complete, a wet or dry etching process may then be used to etch an upper surface of the substrate 302 using the now fully formed mask 306a, as indicated at operation 212. At operation 214 the mask may then be removed, such as by etching, leaving the patterned substrate 302 with a nano-featured surface 310 as shown in FIG. 10.

It is important to note that the additional deposition and dewetting operations at operations 204 and 210 result in a thicker (taller) nanoparticle of one masking material, but just as importantly, with the similar masking area fill-fraction (i.e., nanoparticle masked area and inter-particle period) as the initial mask layer 304a in FIG. 8b. It is believed that one factor that creates this highly desirable characteristic of increasing the thickness (i.e., height) of the mask layer with additional deposition and dewetting operations, while still maintaining the masking area fill-fraction of the initially formed mask, is the initial condition of the layer that has previously been deposited and dewetted (versus just dewetting an entire thicker layer at once). Another factor that is believed to contribute to reducing the lateral dimensions of the particles is when the first masking material that has a low "wettability" on the substrate. By "low wettability" it is meant a tendency to ball-up and not wet the surface of the substrate. This "wettability" has been found to occur, for example, with Au deposited as a mask material on a fused silica substrate. In this case the deeper SEMS are a result of the increase in the height of the nanoparticle mask layer, while maintaining the masking fill-fraction and the SEMS feature-size consistent with the spatial nanoparticle distribution of the initially formed mask layer.

FIGS. 8a-8d show how depositions of different metal mask materials may be used to form nanoparticles from more than one masking material, but which still have similar nanoparticle masked area and a similar inter-particle period to the one created after the first deposition and dewetting operations. FIG. 8a shows an initial structure 400 having a substrate 402 on which is deposited a first metal mask material 404. FIG. 8b shows the first mask material 404 after performing the first dewetting operation, which results in nanoparticles 404a. FIG. 8c shows a different metal mask material 406 having been deposited on the substrate 402, which fills in the interstitial spaces between the nanoparticles 404a as well as covers the nanoparticles 404a. FIG. 8d Shows how the different mask material 406, once dewetted, increases the height of the originally nanoparticles 404a to form new nanoparticles 408, while still maintaining substantially the same inter-particle period created during the initial formation of the nanoparticles 404a (visible in FIG. 8b) in the first deposition and dewetting operations. This feature of maintaining the inter-particle period during the second dewetting operation on the second metal mask material is likely to happen when the second deposited metal mask material has a higher relative wettability on the first deposited metal mask material that it does with respect to its wettability on the substrate 402. The resulting nanoparticle could maintain a bi-layer structure, or become alloyed, depending on the dewetting temperature and material properties. This scenario is especially useful if using a first masking material that gives desirable lateral properties of the mask (i.e., masking area fraction and period) but which provides a low etch ratio to substrate. By "low etch ratio" it is meant that the material is not highly resistant to being eroded away during a subsequently performed etching operation (i.e., is etched away rapidly), relative to the substrate 16, or relative to a different material. In this scenario, the second metal masking material 406 has a higher etch ratio but not as good dewetting on the substrate lateral dimensions, meaning it is not etched away as quickly as the first masking material, but yet does not dewet to provide small enough lateral particle dimensions and spacing as the first material. In this scenario the increase in SEMS thickness is a result of the modified etch ratio and the increased thickness of the finished mask.

FIGS. 9a-9d show another scenario where different metal mask materials are used. A structure 500 begins with a substrate 502 and a first metal material layer 504 deposited on the upper surface of the substrate. A first dewetting operation creates nanoparticles forming a first mask layer 504a having a masking area fraction and an inter-particle period, as shown in FIG. 9b. A second deposition operation is then performed to deposit a second, different metal mask material 506, as shown in FIG. 9c. This results in the interstitial areas in-between the initial nanoparticles of the first mask layer 504a formed at the first (1)+(2) step being filled in with the different mask material 506, as well as the nanoparticles of the first mask layer 504a being covered by the different mask material 506. When a second dewetting operation is performed, as shown in FIG. 9d, the nanoparticles of the first metal mask layer 504a are left at their original height, while the different metal mask material forms nanoparticles 506a that remain in the interstitial spaces between the nanoparticles of the first mask layer 504a. This is likely to happen when the second deposited mask material 506 has lower relative wettability on the first deposited mask material 504 with respect to on the substrate 502. This scenario is useful, like in the example of FIGS. 8a-8d, if using a first masking material that gives desirable lateral properties of the mask but which provides a low etch ratio to substrate. In this example shown in FIGS. 9a-9d, the second masking material has a higher etch ratio but not as good dewetting on substrate properties to result in the required lateral dimensions. In this scenario the increase in SEMS thickness is a result of the modified etch ratio.

Material Considerations

It has been found that gold (Au) is especially advantageous as a material for the thin metal film layer to be dewetted on fused silica. Fused silica is widely used in optics. It has been found that gold forms very small nanoparticles since it does not wet well on a fused silica surface. The size of the nanoparticles is determined by the layer thickness of the gold, the material surface energy properties with respect to the substrate and the dewetting temperature. In order to obtain meta-surface (i.e., homogenized optical properties), the nanoparticles have to be substantially smaller than the optical wavelength. Therefore, for obtaining meta-optics in the visible and ultra-violet wavelength spectra, the nanoparticle size and spacing must be sub-100 nm in dimension. When dewetting metal thin layers there is a smallest (i.e., minimum) practical thickness that can be deposited without substantial oxidation occurring during the dewetting operation under ambient conditions. This consideration limits the material sets that may effectively result in the particle's size and period required to enable a meta-surface. However, gold, due to its low-wetting properties on fused silica and its low tendency to oxidize, enables obtaining these sub-100 nm nanoparticle size distributions.

However, gold, when used as a dry etching mask, will erode substantially faster than other metal mask materials. For example, gold will erode substantially faster than chromium (Cr). Chromium enables an etch depth into fused silica which is larger by about an order of magnitude over what can be accomplished with gold. Nevertheless, as mentioned above, chromium wets very well on fused silica and generates orders of magnitude larger periods and particle sizes under dewetting (for a given layer thickness). However, combined with its higher tendency to oxidize, it may have limited applicability as a mask material with the methods described herein.

A limited depth of the mask layer could be important if the material has very high resistivity to dry etching (e.g., sapphire) or if the optical performance is sensitive to the layer depth. Such a factor would be important when considering reflection in a layer that is functioning as anti-reflective surface layer, or an equivalent OPD for a device intended to operate as an optic.

Utilizing the approach illustrated in FIGS. 7a-7d, we experimentally found that when repeating thin layers of gold deposition and dewetting each thin gold layer, the lateral dimensions of the resulting nanoparticles that are grown in height are determined by the thickness of a single thin layer, while the height of the nanoparticles of the finished mask is determined by the cumulative deposition. As an example, if we deposit a 7.5 nm layer of gold, dewet it and then deposit a second 7.5 nm layer of gold and then dewet it, the lateral dimensions of the nanoparticles will be similar to that resulting from just the first 7.5 nm thin layer dewetting (i.e., much smaller than what would be achieved by dewetting a 15 nm thick gold layer). However, the height of the nanoparticle may approximately double with respect to one 7.5 nm layer dewetting to about 15 nm. This was validated experimentally even to as many as five deposit-dewet steps. Since the etch depth into the fused silica substrate is proportional to the nanoparticle height, this translates into a substantial increase in the enabled meta-surface layer thickness, while maintaining the adequate lateral size-distribution of the nanoparticles.

The approaches of FIGS. 8a-8d and 9a-9d are combining the advantages of the two materials, where the material with the lower wetting properties (e.g., gold) is used to entrain the lateral distribution of the nanoparticles, while the material with the higher resilience to etching is being laterally entrained and generates, in fact, the mask for the etching.

Potential materials which may be used to provide oxidation free dewetting with medium etching selectivity are gold and platinum (Pt). Potential materials to be used as high etching selectively masks are chromium (Cr), copper (Cu), palladium (Pd), aluminum (Al) and nickel (Ni).

The methods of the present disclosure could be implemented using different method variations to optimize them for different applications. The de-wetting step of the initial or subsequent thin metal layers, resulting in the finished etch mask, could be implement using various methods of heat deposition. Some examples are thermal annealing in furnace, pulsed laser, LED or laser diodes array, or other illumination sources. While thermal annealing presents a relatively simple solution with high spatial uniformity, the illumination various irradiation methods described herein (e.g., raster scanned laser 12) present temporal energy deposition control (e.g., adjusting the laser pulse shape), spatial control (e.g., laser rastering or shaped transmission masks) and an advantage when using temperature sensitive substrates. The etching step through the initial mask or a subsequently formed mask could be implemented using dry or wet etching methods. While the dry etching (e.g., RIE) may achieve deeper surface modulations, wet etching is still an attractive process as it provides high laser-induced damage thresholds ("LIDT") and further simplicity.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for creating an optical component having a spatially controlled refractive index, the method comprising:
   providing a substrate;
   performing a first deposition operation to form a first metal material layer on a surface of the substrate using a first material having a first wetting characteristic relative to the substrate;
   performing a first dewetting operation by heating the first metal material layer to create a first layer of a mask having a plurality of nanoparticles with a spatially varying nanoparticle distribution, and with a first height;
   performing a second deposition operation to deposit a second metal material layer on the surface of the substrate using a second material having a second wetting characteristic relative to the substrate;

performing a second dewetting operation to dewet the second metal material layer, the second dewetting operation causing the second metal material layer to accumulate on the nanoparticles to form a second layer of the mask, which increases the first height to a second height, and thus an overall thickness of the mask, without changing the spatially varying nanoparticle distribution of the mask; and after the mask has been increased to the second height, then etching a surface of the substrate using the mask to imprint a spatially patterned nanostructure pattern on a surface of the substrate in accordance with the spatially varying nanoparticle distribution.

2. The method of claim 1, wherein the first wetting characteristic is different from the second wetting characteristic.

3. The method of claim 1, wherein the first wetting characteristic is the same as the second wetting characteristic.

4. The method of claim 1, wherein the first and second materials comprise identical materials.

5. The method of claim 1, wherein at least one of the first and second materials comprises:
gold; or
aluminum; or
chromium; or
palladium; or
nickel.

6. The method of claim 1, further comprising after the etching of the surface is performed, then removing the mask from the substrate.

7. The method of claim 1, wherein the second dewetting operation is achieved by heating of the second metal material layer.

8. The method of claim 1, wherein the dewetting of the first metal material layer comprises using a laser to achieve dewetting of the first metal material layer to form the mask.

9. The method of claim 1, wherein overlapping raster scanned passes of an optical light source are used to irradiate the first metal material layer and the second metal material layer, to thereby dewet the first and second metal material layers.

10. The method of claim 1, wherein the first and second dewetting operations are performed using at least one light emitting diode (LED).

11. The method of claim 1, wherein the first and second dewetting operations are performed using thermal processing.

12. The method of claim 1, wherein the etching comprises performing a wet etching process.

13. The method of claim 1, wherein after the mask has been increased to the second height, an additional plurality of deposition and dewetting operations are performed to further increase an overall height of the mask to a finished height which is greater than the second height, before etching the surface of the substrate using the mask at the finished height.

14. The method of claim 1, wherein the etching comprises performing a dry etching process to imprint the spatially patterned nanostructure pattern on the surface of the substrate.

15. The method of claim 14, wherein the dry etching process comprises a reactive ion etching (RIE) process.

16. A method for creating an optical component having a spatially controlled refractive index, the method comprising:
providing a substrate;
performing a first deposition operation to deposit a first material to form a first metal material layer on a surface of the substrate using a first etching ratio characteristic relative to the substrate;
performing a first dewetting operation by heating the first metal material layer to create a first masking layer having a plurality of nanoparticles with a spatially varying nanoparticle distribution, and with a first height;
performing a second deposition operation to form a second metal material layer on the surface of the substrate using a second material;
performing a second dewetting operation to dewet the second metal material layer, the second dewetting operation causing the second metal material layer to accumulate in interstitial spaces between the nanoparticles of the first metal material layer to form a second masking layer, and where the second material has a second etching ratio characteristic relative to the substrate which is different than the first etching ratio characteristic; and
etching a surface of the substrate using the first and second masking layers to imprint a spatially patterned nanostructure pattern on a surface the substrate in accordance with the spatially varying nanoparticle distribution of the first masking layer.

17. The method of claim 16, wherein the first and second materials have different wetting characteristics relative to the substrate.

18. The method of claim 16, wherein the dewetting of the first metal material layer comprises using a laser to generate an optical signal to achieve de-wetting of the first metal layer to form the mask, and wherein the laser is raster scanned over the first and second masking layers.

19. The method of claim 16, wherein the etching comprises performing at least one of:
a dry etching process to imprint the spatially patterned nanostructure pattern on the surface; or
a wet etching process.

20. The method of claim 16, wherein the etching comprises performing a dry etching process using a reactive ion etching (RIE) operation.

* * * * *